(12) United States Patent
Felsl et al.

(10) Patent No.: US 9,385,181 B2
(45) Date of Patent: Jul. 5, 2016

(54) SEMICONDUCTOR DIODE AND METHOD OF MANUFACTURING A SEMICONDUCTOR DIODE

(71) Applicant: Infineon Technologies AG, Neubiberg (DE)

(72) Inventors: Hans Peter Felsl, Munich (DE); Elmar Falck, Ottobrunn (DE); Manfred Pfaffenlehner, Munich (DE); Frank Hille, Munich (DE); Andreas Haertl, Munich (DE); Holger Schulze, Villach (AT); Daniel Schloegl, Villach (AT)

(73) Assignee: Infineon Technologies AG, Neubiberg (DE)

( * ) Notice: Subject to any disclaimer, the term of this patent is extended or adjusted under 35 U.S.C. 154(b) by 151 days.

(21) Appl. No.: 14/162,311

(22) Filed: Jan. 23, 2014

(65) Prior Publication Data

US 2015/0206983 A1    Jul. 23, 2015

(51) Int. Cl.
| | |
|---|---|
| *H01L 29/861* | (2006.01) |
| *H01L 29/06* | (2006.01) |
| *H01L 29/66* | (2006.01) |
| *H01L 29/36* | (2006.01) |
| *H01L 29/16* | (2006.01) |
| *H01L 29/20* | (2006.01) |

(52) U.S. Cl.
CPC ...... *H01L 29/0603* (2013.01); *H01L 29/66128* (2013.01); *H01L 29/8611* (2013.01); *H01L 29/1608* (2013.01); *H01L 29/2003* (2013.01); *H01L 29/36* (2013.01)

(58) Field of Classification Search
CPC .................................................. H01L 29/6609
See application file for complete search history.

(56) References Cited

U.S. PATENT DOCUMENTS

| | | | | |
|---|---|---|---|---|
| 4,074,303 | A | 2/1978 | Benda et al. | |
| 4,754,310 | A * | 6/1988 | Coe | H01L 29/0634 257/287 |
| 4,985,741 | A * | 1/1991 | Bauer | H01L 29/7395 257/133 |
| 6,191,466 | B1 * | 2/2001 | Yamashita | H01L 21/761 257/481 |
| 6,239,466 | B1 | 5/2001 | Elasser et al. | |
| 6,259,134 | B1 * | 7/2001 | Amaratunga | H01L 27/0716 257/135 |
| 2005/0133857 | A1 * | 6/2005 | Mauder | H01L 29/0834 257/327 |
| 2007/0023830 | A1 * | 2/2007 | Pfirsch | H01L 29/0634 257/341 |
| 2012/0193743 | A1 * | 8/2012 | Kawahito | G01S 7/4816 257/435 |
| 2013/0264607 | A1 * | 10/2013 | Werber | H01L 29/7396 257/124 |

FOREIGN PATENT DOCUMENTS

| | | |
|---|---|---|
| DE | 2506102 A1 | 7/1981 |
| DE | 19823944 A1 | 12/1999 |
| DE | 19843659 A1 | 4/2000 |
| DE | 10361136 B4 | 10/2005 |

* cited by examiner

*Primary Examiner* — Lex Malsawma
(74) *Attorney, Agent, or Firm* — Murphy, Bilak & Homiller, PLLC (57) ABSTRACT

A semiconductor diode includes a semiconductor body having opposite first and second sides. A first and a second semiconductor region are consecutively arranged along a lateral direction at the second side. The first and second semiconductor regions are of opposite first and second conductivity types and are electrically coupled to an electrode at the second side. The semiconductor diode further includes a third semiconductor region of the second conductivity type buried in the semiconductor body at a distance from the second side. The second and third semiconductor regions are separated from each other.

12 Claims, 8 Drawing Sheets

FIG 10D

SEMICONDUCTOR DIODE AND METHOD OF MANUFACTURING A SEMICONDUCTOR DIODE

BACKGROUND

In semiconductor device design such as power semiconductor diode design a trade-off between various electric parameters has to be met. By way of example, while an increase in a charge-carrier plasma in the power semiconductor diode allows for a reduction of conducting losses of the power semiconductor diode, the increase of the charge-carrier plasma also requires an increased extraction of charge-carriers when switching off the power semiconductor diode. Therefore, a trade-off between conducting losses and switching losses has to be met.

It is desirable to improve the trade-off between conducting losses and switching losses of a diode.

SUMMARY

An embodiment of a semiconductor diode comprises a semiconductor body having opposite first and second sides. A first and a second semiconductor region are consecutively arranged along a lateral direction at the second side. The first and second semiconductor regions are of opposite first and second conductivity types and are electrically coupled to an electrode at the second side. The semiconductor diode further comprises a third semiconductor region of the second conductivity type buried in the semiconductor body at a distance from the second side. The second and third semiconductor regions are separated from each other.

An embodiment of manufacturing a semiconductor diode in a semiconductor body having opposite first and second sides comprises forming a first semiconductor region and a second semiconductor region consecutively arranged along a lateral direction at the second side. The first and second semiconductor regions are of opposite first and second conductivity types. The method further comprises forming a third semiconductor region of the second conductivity type buried in the semiconductor body at a distance from the second side. The second and third semiconductor regions are separated from each other. The method further comprises forming an electrode at the second side, wherein the electrode is electrically coupled to the first and second semiconductor regions.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the disclosure and are incorporated in and constitute a part of this specification. The drawings illustrate the embodiments of the present disclosure and together with the description serve to explain principles of the disclosure. Other embodiments and intended advantages will be readily appreciated as they become better understood by reference to the following detailed description.

FIGS. 8A to 10D are schematic cross-sectional views of a semiconductor body for illustrating embodiments of manufacturing a semiconductor diode.

DETAILED DESCRIPTION

In the following detailed description, reference is made to the accompanying drawings, which form a part hereof, and in which are shown by way of illustrations specific embodiments in which the disclosure may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present disclosure includes such modifications and variations. The examples are described using specific language that should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open and the terms indicate the presence of stated structures, elements or features but not preclude the presence of additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may exist between the electrically coupled elements, for example elements that temporarily provide a low-ohmic connection in a first state and a high-ohmic electric decoupling in a second state.

The Figures illustrate relative doping concentrations by indicating "−" or "+" next to the doping type "n" or "p". For example, "n$^-$" means a doping concentration that is lower than the doping concentration of an "n"-doping region while an "n$^+$"-doping region has a higher doping concentration than an "n"-doping region. Doping regions of the same relative doping concentration do not necessarily have the same absolute doping concentration. For example, two different "n"-doping regions may have the same or different absolute doping concentrations.

Figure 1:
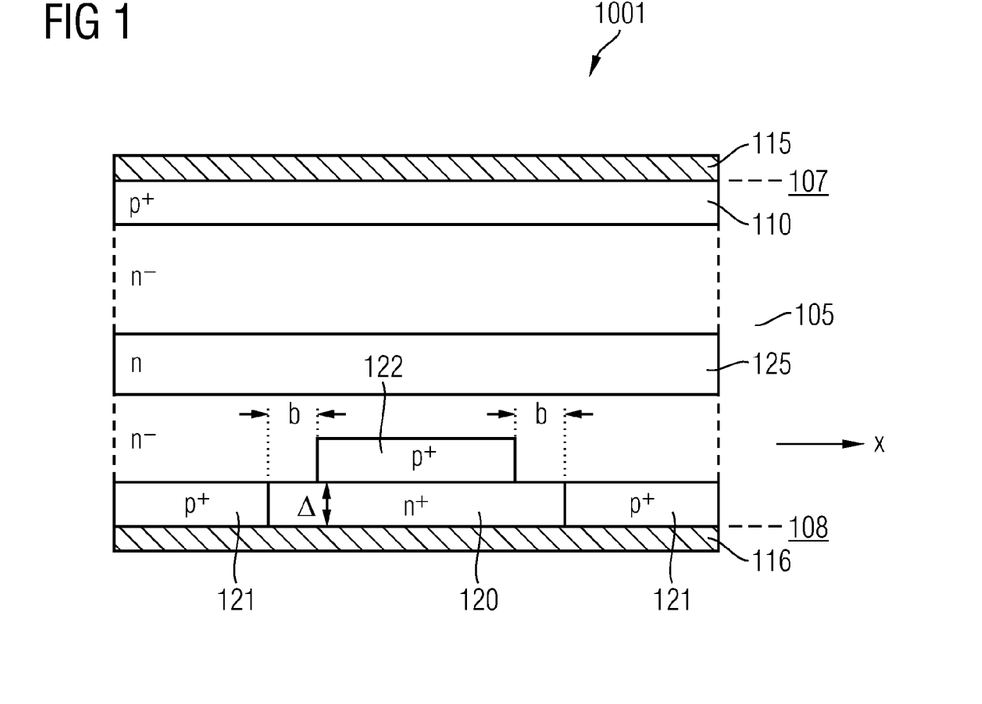
FIGS. 1 to 3 illustrate schematic cross-sectional views of embodiments of a semiconductor diode including a buried third semiconductor region disposed with respect to consecutively arranged first and second semiconductor regions of opposite conductivity type.

FIG. 1 is a schematic cross-sectional view of a portion of a semiconductor diode 1001 according to an embodiment.

The semiconductor diode 1001 includes a semiconductor body 105. The semiconductor body 105 may include a semiconductor substrate, e.g. a silicon (Si) substrate, a silicon carbide (SiC) substrate, a gallium nitride (GaN) substrate or another single semiconductor or compound semiconductor substrate. Furthermore, one or more optional semiconductor layer(s), e.g. epitaxial semiconductor layers, may be formed on the semiconductor substrate.

The semiconductor diode 1001 includes a p$^+$-doped anode region 110 at a first side 107 of the semiconductor body 105. By way of example, the first side 107 may be a front side of the semiconductor body 105 where bond wires may be electrically coupled to an anode electrode 115. The anode electrode 115 is electrically connected to the p$^+$-doped anode region 110 at the first side 107.

The semiconductor diode 1001 further includes a first n$^+$-doped semiconductor region 120 and a second p$^+$-doped semiconductor region 121 consecutively arranged along a lateral direction x at a second side 108 of the semiconductor body 105. By way of example, the second side 108 of the semiconductor body 105 may be attached to a carrier, e.g. a lead frame.

A cathode electrode 116 is electrically connected to the first and second semiconductor regions 120, 121 at the second side.

The semiconductor diode 1001 further includes a p$^+$-doped third semiconductor region 122 buried in the semiconductor body 105 at a distance Δ from the second side 108.

The second and third semiconductor regions 121, 122 are separated from each other, i.e. there is a space between the second and third semiconductor regions 121, 122. In the embodiment illustrated in FIG. 1, the third semiconductor region 122 is disposed at a lateral distance b from the second semiconductor region 121 to the right. Likewise, the third semiconductor region 122 is disposed at a lateral distance b to the second semiconductor region 121 to the left. According to other embodiments, the distance of the p$^+$-doped second semiconductor region 121 to the left of the p$^+$-doped third semiconductor region 122 differs from the distance of the p$^+$-doped second semiconductor region 121 to the right side of the p$^+$-doped third semiconductor region 122.

According to an embodiment, the lateral distance b between a lateral termination of the p$^+$-doped second semiconductor region 121 and a lateral termination of the p$^+$-doped third semiconductor region 122 is in a range between 0.1 μm and 5 μm.

According to an embodiment, the semiconductor diode 1001 comprises a plurality of third semiconductor regions 122 spaced apart from each other. A lateral distance between neighbouring third semiconductor regions may be in a range between 1.0 μm and 1000.0 μm.

In the embodiment illustrated in FIG. 1 the p$^+$-doped third semiconductor region 122 adjoins the n$^+$-doped first semiconductor region 120 without an intervening part of the n$^-$-doped semiconductor body 105.

The semiconductor diode 1001 further includes an optional n-doped field stop zone 125 between the first side 107 and the p$^+$-doped third semiconductor region 122.

The semiconductor diode 1001 allows for an improvement of the soft switching behavior. When switching off the semiconductor diode 1001, electrons are extracted at the cathode electrode 116 at a positive voltage, whereas holes are extracted at the anode electrode 115 at a negative voltage. The buried p$^+$-doped third semiconductor region 122 hinders the extraction of electrons through the n$^+$-doped first semiconductor region 120 to the cathode electrode 116 by narrowing a width of an extraction area to the lateral width b. Furthermore, injection of holes by the p$^+$-doped second semiconductor regions 121 is increased due to an increased voltage drop along the constricted extraction area of electrons reaching the n$^+$-doped first semiconductor region 120. As a result of the above measure decomposition of a charge-carrier plasma at a cathode side of the semiconductor diode 1001 during switching-off operation can be decelerated resulting in a softer switching behavior.

Figure 2:
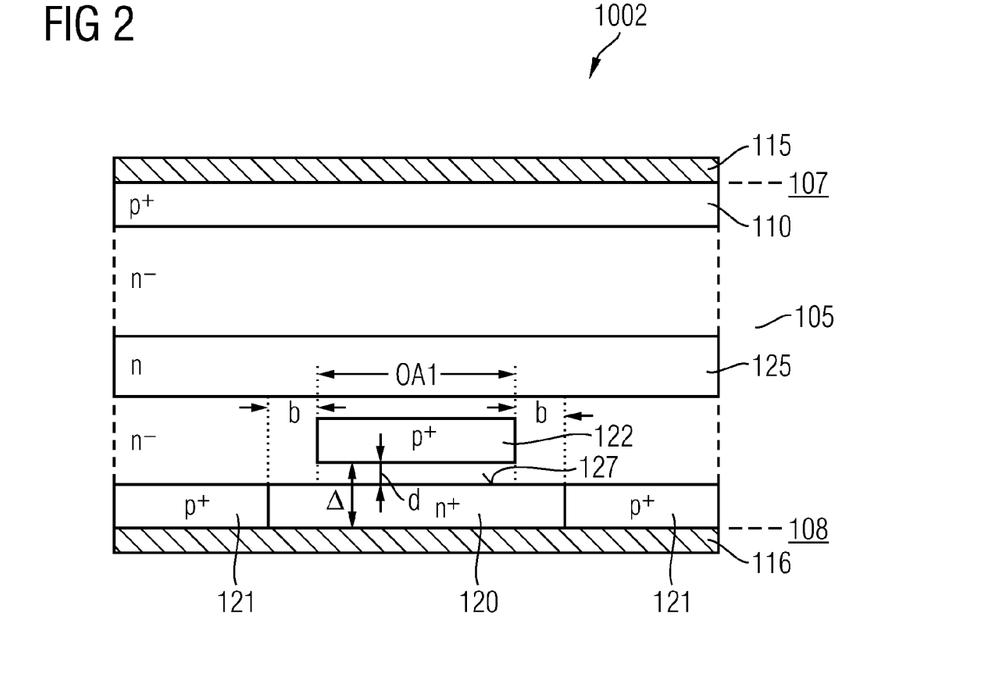

FIG. 2 illustrates a schematic cross-sectional view of another embodiment of a semiconductor diode 1002 including the buried p$^+$-doped third semiconductor region 122 disposed with respect to the consecutively arranged n$^+$-doped first and p$^+$-doped second semiconductor regions 120, 121. In the embodiment illustrated in FIG. 2, the p$^+$-doped third semiconductor region 122 is not only spaced apart from the p$^+$-doped second semiconductor region 121, but further has a vertical distance d with respect to the n$^+$-doped first semiconductor region 120. Thus, electrons extracted during a switching-off period of the semiconductor diode 1002 may also enter a top face 127 of the n$^+$-doped first semiconductor region 120 in an overlap area OA1 of the first and third semiconductor regions 120, 122. This allows for a further adjustment of charge-carrier decomposition during a switching-off period of the semiconductor diode 1002.

Figure 3:
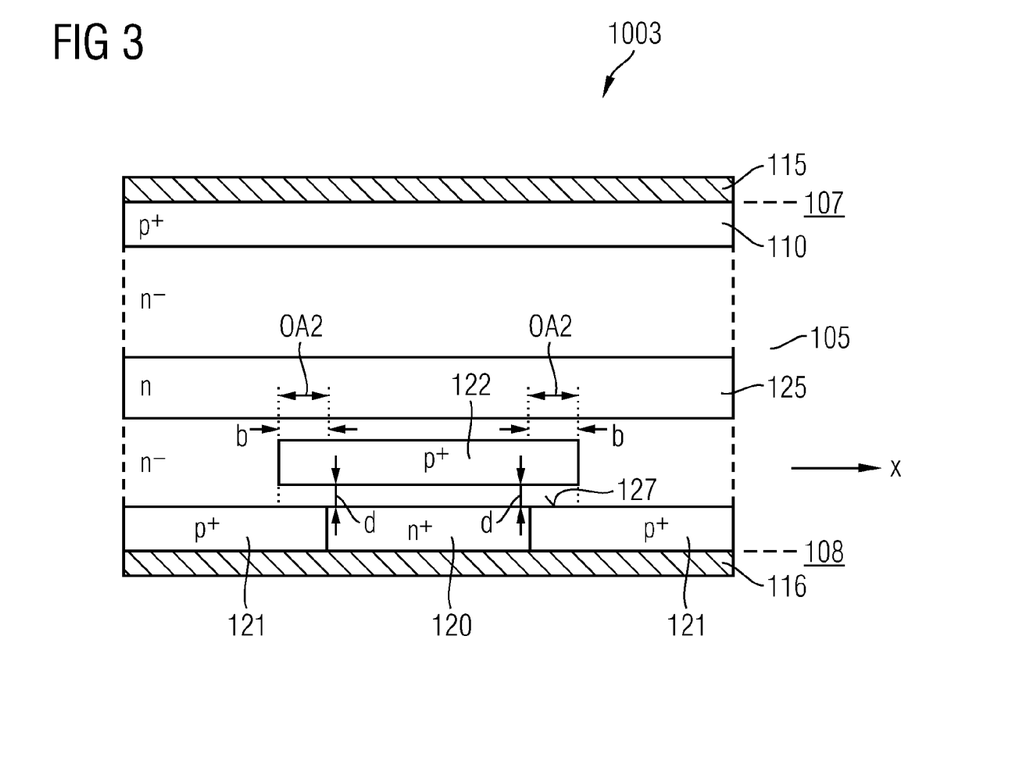

FIG. 3 illustrates a schematic cross-sectional view of another embodiment of a semiconductor diode 1003 including the buried p$^+$-doped third semiconductor region disposed with respect to the consecutively arranged n$^+$-doped first and p$^+$-doped second semiconductor regions 120, 121. Similar to the embodiment illustrated in FIG. 2, the p$^+$-doped third semiconductor region 122 has a vertical distance d with respect to the first n$^+$-doped first semiconductor region 120.

Further, areas of the second and third semiconductor regions 121, 122 projected onto the second side 108 overlap in an overlap area OA2. According to an embodiment, a lateral dimension l of the overlap area OA2 and a vertical distance d between the second and third semiconductor regions 121, 122 in the overlap area OA2 satisfy 0<d/l<2. According to an embodiment, the distance d is in a range of 0.1 μm to 5 μm.

Electrons extracted during a switching-off period of the semiconductor diode 1003 may enter a top face 127 of the n$^+$-doped first semiconductor region 120 after passing a channel along the lateral dimension l of the overlap area OA2. This allows for a further adjustment of charge-carrier decomposition during a switching-off period of the semiconductor diode 1003.

Figure 4:
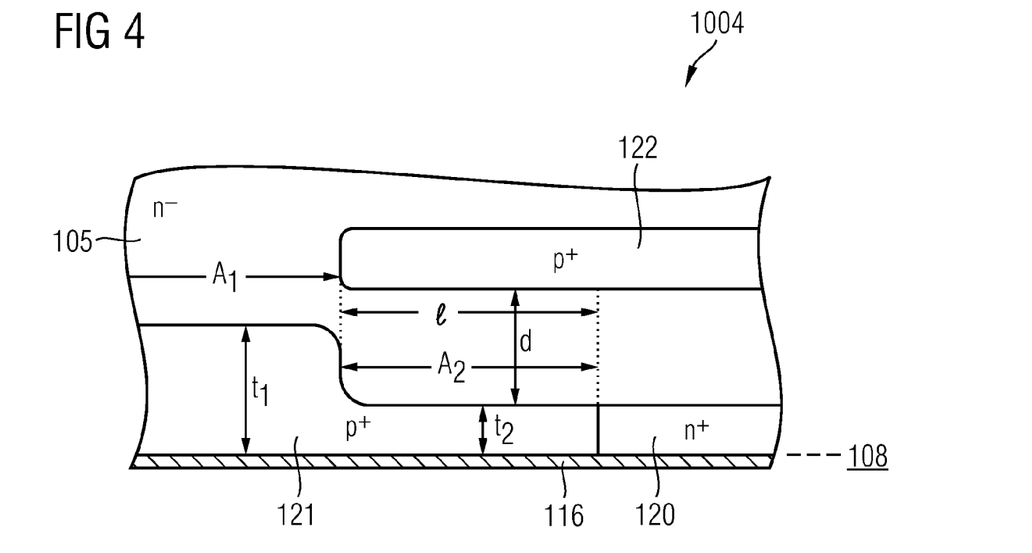
FIG. 4 illustrates a schematic cross-sectional view of one embodiment of a semiconductor diode including an arrangement of the first to third semiconductor regions similar to the embodiment illustrated in FIG. 3.

FIG. 4 illustrates a schematic cross-sectional view of a semiconductor diode 1004 including an arrangement of the first to third semiconductor regions 120, 121, 122 similar to the embodiment of the semiconductor diode 1003 illustrated in FIG. 3. The p$^+$-doped second semiconductor region 121 has a first thickness $t_1$ in a first area $A_1$ and a second thickness $t_2$ smaller than the first thickness $t_1$ in a second area $A_2$. The second area $A_2$ overlaps with the p$^+$-doped third semiconductor region 122 with respect to a projection of the second and third semiconductor regions 121, 122 onto the second side 108.

According to an embodiment of the semiconductor diode 1004 a lateral width l of the second area $A_2$ and a vertical distance d between the second and third semiconductor regions 121, 122 satisfy 0<d/l<2.

In the embodiment illustrated in FIG. 4, a border between the first and second areas $A_1, A_2$ coincides with a termination of the third semiconductor region 122. According to other embodiments, the border between the first and second areas $A_1, A_2$ is outside of an area of the third semiconductor region 122.

The semiconductor diode 1004 illustrated in FIG. 4 allows for a beneficial adjustment of charge-carrier plasma decomposition during a switching-off period by adjusting a flow of electrons from the charge-carrier plasma in a drift zone of the semiconductor body 105 along the second and third semiconductor regions 121, 122 and through the n⁺-doped first semiconductor region 120 to the cathode electrode 116.

FIGS. 5A to 5E illustrate schematic top views of embodiments of the semiconductor diodes illustrated in FIGS. 1 to 4.

Figure 5A:
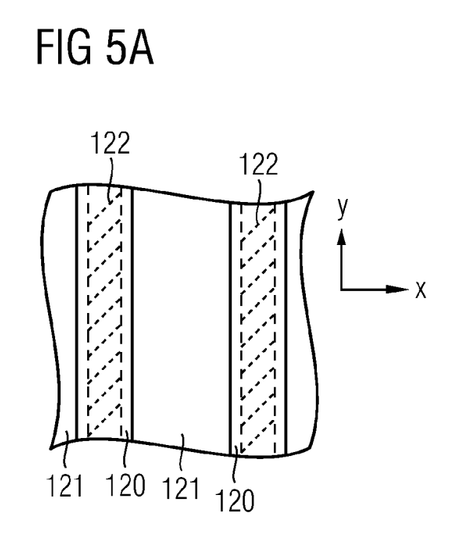
FIGS. 5A to 5E are schematic top views of embodiments of the semiconductor diode illustrated in FIGS. 1 to 4.

In the embodiment illustrated in the top view of FIG. 5A, the first to third semiconductor regions 120, 121, 122 are shaped as stripes extending in parallel to each other along a lateral direction y. The lateral direction y may correspond to a direction perpendicular to a drawing plane of each of FIGS. 1 to 4, for example. In the embodiment illustrated in the top view of FIG. 5A, the p⁺-doped third semiconductor region 122 does not overlap with the p⁺-doped second semiconductor region 121 similar to the schematic cross-sectional views of the embodiments illustrated in FIGS. 1 and 2. According to another embodiment, the p⁺-doped third semiconductor region 122 overlaps with the p⁺-doped second semiconductor region 121 in an overlap area similar to the embodiments illustrated in FIGS. 3 and 4.

Figure 5B:
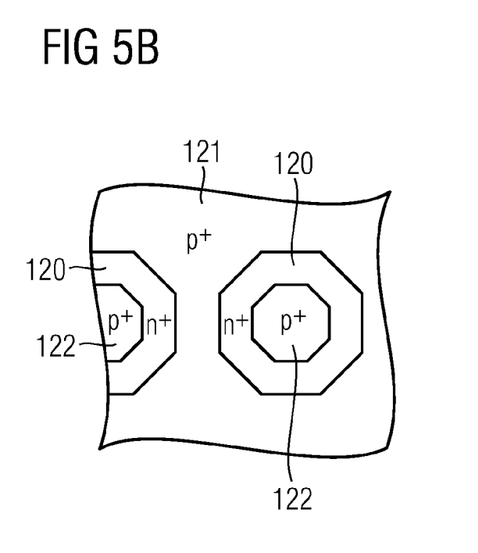

In the embodiment illustrated in the top view of FIG. 5B, the first and third semiconductor regions 120, 122 are shaped as octagons. Separate first semiconductor regions 120 are surrounded by a continuous p⁺-doped second semiconductor region 121. The dimensions and overlap areas between any two of the first to third semiconductor regions 120, 121, 122 described with respect to the embodiments illustrated in FIGS. 1 to 4 likewise apply to the embodiment of FIG. 5B.

Figure 5C:
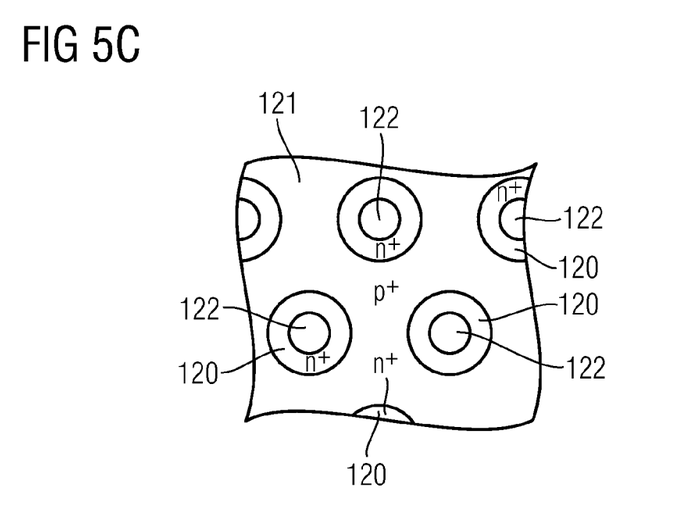

In the embodiment illustrated in the top view of FIG. 5C, the first and third semiconductor regions 120, 122 are shaped as circles. Separate first semiconductor regions 120 are surrounded by a continuous p⁺-doped second semiconductor region 121. The dimensions and overlap areas between any two of the first to third semiconductor regions 120, 121, 122 described with respect to the embodiments illustrated in FIGS. 1 to 4 likewise apply to the embodiment of FIG. 5C.

Figure 5D:
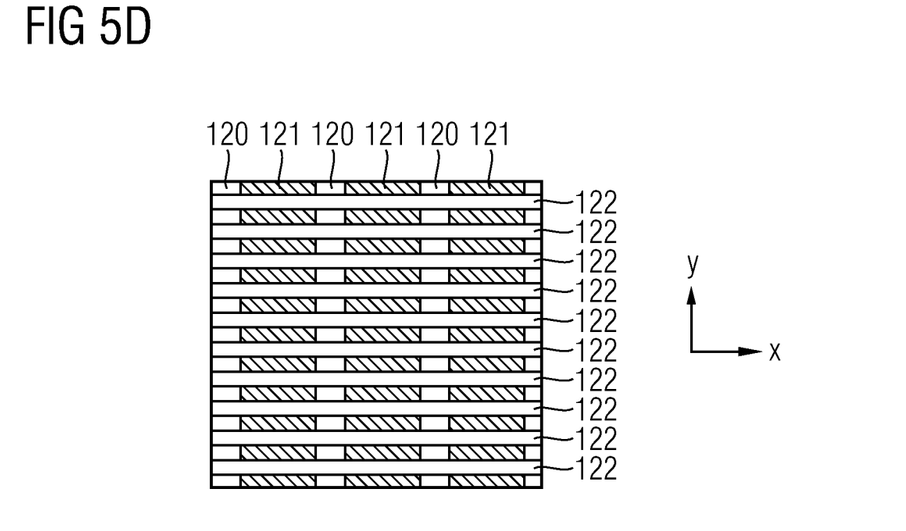

In the embodiment illustrated in the top view of FIG. 5D, the first to third semiconductor regions 120, 121, 122 are shaped as stripes. The first and second semiconductor regions 120, 121 are consecutively arranged along the lateral direction x and extend in parallel to each other along a lateral direction y perpendicular to the lateral direction x. The third semiconductor regions 122 are consecutively arranged along the lateral direction y and extend in parallel to each other along a lateral direction x perpendicular to the lateral direction y.

Figure 5E:
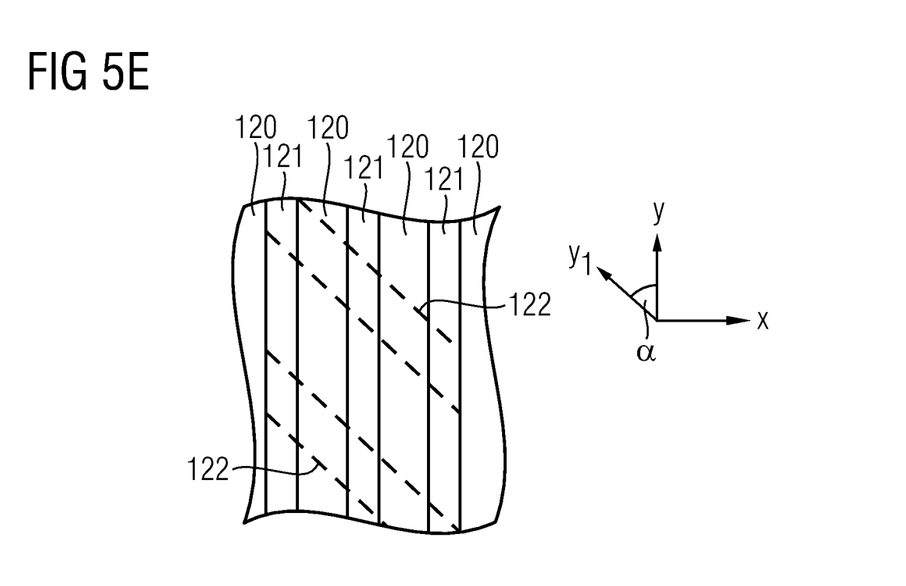

In the embodiment illustrated in the top view of FIG. 5E, the first to third semiconductor regions 120, 121, 122 are shaped as stripes. The first and second semiconductor regions 120, 121 are consecutively arranged along the lateral direction x and extend in parallel to each other along the lateral direction y perpendicular to the lateral direction x. The third semiconductor regions 122 extend in parallel to each other along a lateral direction $y_1$. An angle $\alpha$, $0<\alpha<90°$ is between the lateral directions $y_1$ and y. to the lateral direction y. The embodiments illustrated in FIGS. 5D, 5E allow for a precise adjustment of dimensions of an electron extraction region during a switching-off period of the semiconductor diode and require minimum lithographic adjustment of the third semiconductor region 122 relative to the first and second semiconductor regions 120, 121.

Figure 6:
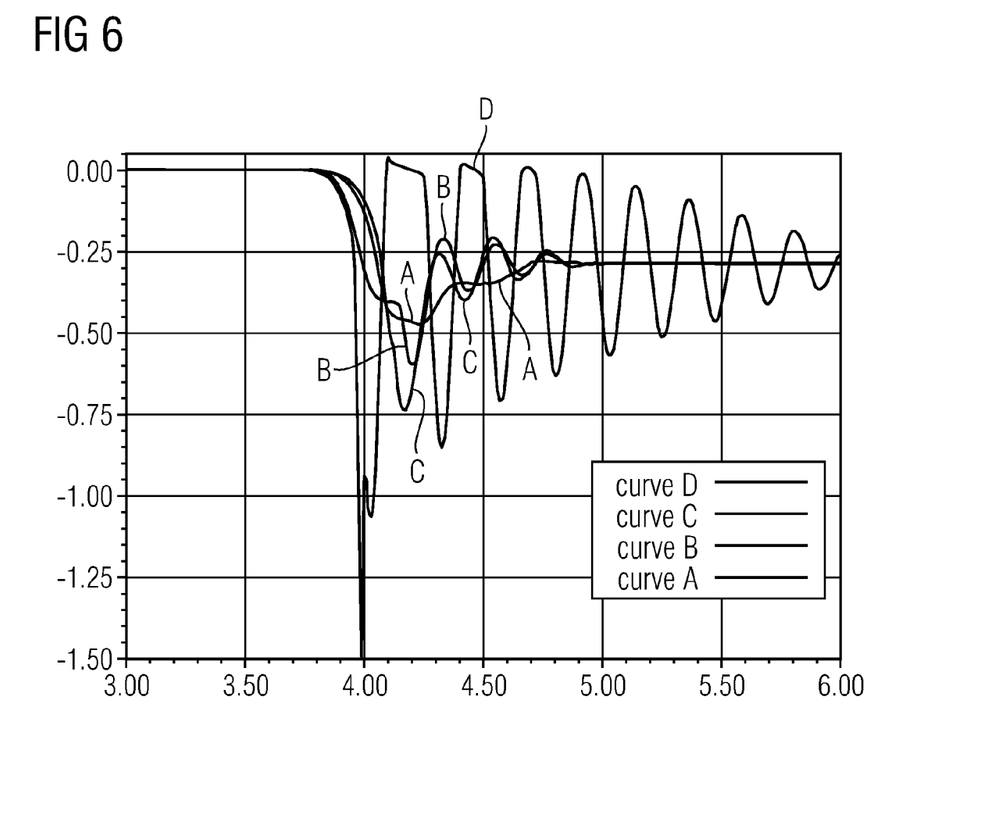
FIG. 6 is a graph illustrating a switching behavior of a semiconductor diode including the first to third semiconductor regions and of several reference diodes.

In the schematic graph of FIG. 6 a switching behavior of a semiconductor diode including the first to third semiconductor regions 120, 121, 122 is illustrated with respect to several reference diodes. The graph illustrates a simulated voltage in arbitrary units versus time in arbitrary units during switching-off operation of the semiconductor diode.

Curve A represents an embodiment including the first to third semiconductor regions 120, 121, 122.

Curve B represents a reference structure including a buried p⁺-doped third semiconductor region 122 and a continuous n⁺-doped first semiconductor region 120 without any p⁺-doped second semiconductor regions 121.

Curve C represents a reference structure including the first and second semiconductor regions 120, 121 of opposite conductivity type and consecutively arranged along a lateral direction at a cathode side of the reference diode. Any p⁺-doped buried third semiconductor regions 122 are missing in the reference diode represented by the curve C.

Curve D represents a reference diode without and second or third p⁺-doped semiconductor regions. The semiconductor diode represented by curve D includes a continuous n⁺-doped cathode region at a cathode side of the reference diode.

A characteristic of overvoltage peaks in the turn-off behavior of curves A to D is a measure of the switching behavior of the semiconductor diodes. Soft switching behavior is characterized by reduced or suppressed overvoltage peaks.

The reference diode represented by curve C allows for a softer switching behavior than the reference diode represented by curve D due to the presence of second p⁺-doped semiconductor regions 121. Likewise, the reference diode represented by curve B allows for a softer switching behavior than the reference diodes represented by curves C and D due to the presence of the third semiconductor region 122.

The semiconductor diode including the first to third semiconductor regions 120, 121, 122 (curve A) exhibits the lowest overvoltage peaks with respect to semiconductor diodes represented in the graph of FIG. 6 due to the presence of the first to third semiconductor regions 120, 121, 122. Thus, the soft switching behavior of the semiconductor diode represented by curve A is superior to the reference diodes represented by curves B, C and D.

Figure 7:
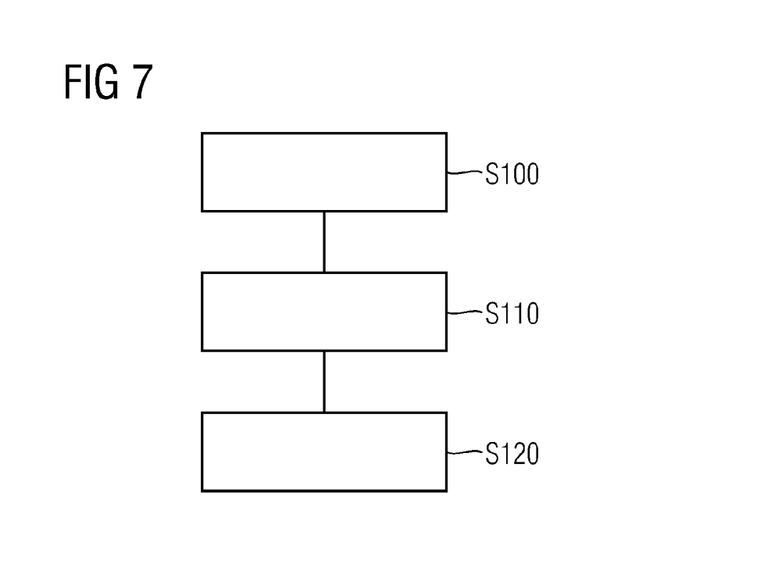
FIG. 7 is a simplified flow chart of an embodiment of a method of manufacturing a semiconductor diode.

FIG. 7 refers to a method of manufacturing a semiconductor diode in a semiconductor body having opposite first and second sides.

Process feature S100 includes forming a first semiconductor region and a second semiconductor region consecutively arranged along a lateral direction at the second side. The first and second semiconductor regions are of opposite first and second conductivity types.

Process feature S110 includes forming a third semiconductor region of the second conductivity type buried in the semiconductor body at a distance from the second side. The second and third semiconductor regions are separated from each other.

Process feature S120 includes forming an electrode at the second side. The electrode is electrically coupled to the first and second semiconductor regions.

Other process features may be carried out before, between or after any one of the process features described above. Furthermore, a sequence of carrying out the process features may differ from the sequence described above. For example, the third semiconductor region of the second conductivity type may be formed before the first and/or second semiconductor region(s).

According to an embodiment, the first to third semiconductor regions are formed by introducing second dopants of the second semiconductor region into the semiconductor body through the second side. First dopants of the first semiconductor region are introduced into the semiconductor body through the second side. The first dopants counter-dope the second dopants in the second semiconductor region. The embodiment further includes introducing third dopants of the third semiconductor region into the semiconductor body through the second side. The semiconductor body is annealed for activating the first to third dopants. Annealing the semiconductor body may be carried out once or several times for activating the first to third dopants. Whereas the second and third dopants are of a same conductivity type, e.g. an n-type or a p-type, the first dopants are of an opposite conductivity type. The second and third dopants may include or consist of a same dopant species, e.g. boron (B), indium (In), aluminum (Al), gallium (Ga) for p-doping in silicon or phosphorus (P), antimony (Sb), arsenic (As) for n-doping in silicon.

Annealing the semiconductor body may be carried out by at least one of laser annealing, furnace annealing and rapid thermal processing, for example.

FIGS. 8A to 10D are schematic cross-sectional views of a semiconductor body for illustrating embodiments of manufacturing a semiconductor diode.

Figure 8A:
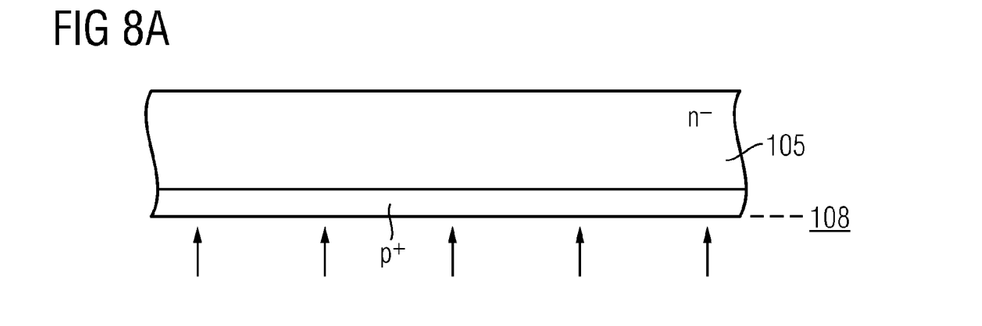

Referring to the schematic cross-sectional view of FIG. 8A, p-type dopants are introduced into the n⁻-doped semiconductor body 105 through the second side 108. The p-type dopants may include one or more of the dopant species boron, antimony, aluminum, indium, for example. The p-type dopants may be introduced through the second side by ion implantation and/or diffusion, for example.

Figure 8B:
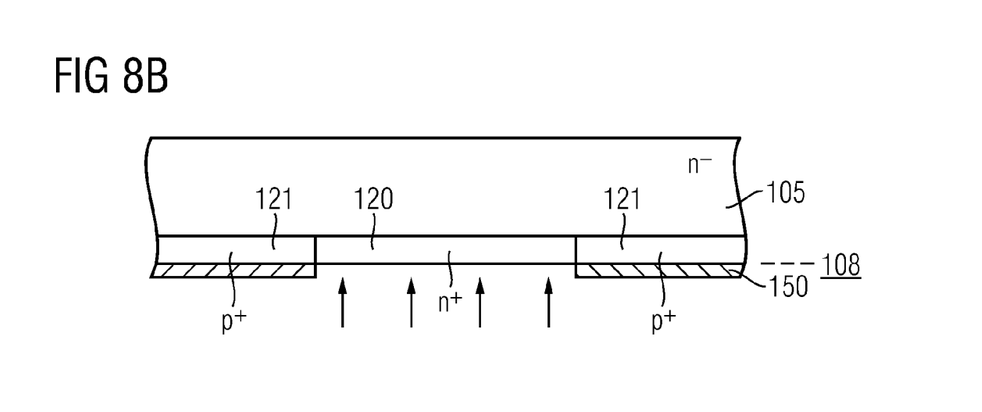

Referring to the schematic cross-sectional view of FIG. 8B, n-type dopants are introduced into the n⁻-doped semiconductor body 105 through the second side 108. A part of the second side 108 is covered by a mask 150, e.g. a patterned hard mask layer or a resist layer. Examples of dopant species for the n-type dopants are phosphorus, arsenic, antimony, for example.

The n-type dopants introduced into the n⁻-doped semiconductor body 105 through the second side 108 counter-dope a corresponding part of the p-type dopants introduced beforehand. Thus, an area at the second side 108 that is not covered by the mask 150 defines the n⁺-doped first semiconductor region 120. A remaining part of the semiconductor body 105 doped with the p-type dopants through the second side 108 define the second semiconductor regions 121.

Referring to the schematic cross-sectional view of FIG. 8C, p-type dopants are introduced into the semiconductor body 105 through the second side 108 and buried below the second side 108 at the distance Δ. According to an embodiment, the p-type dopants may be introduced by ion implantation, for example. The p-type dopants may be introduced into the semiconductor body 105 only in portions that are not covered by a mask 151. The mask 151 may be formed at the second side 108 as a patterned hard mask layer and/or a patterned resist layer by lithography after removing the mask 150 illustrated in FIG. 8B. Alignment of the p-type dopants introduced in the process illustrated in FIG. 8C with respect to the n⁺-doped first semiconductor region 120 may be achieved by using common alignment marks at the second side with respect to lithography during formation of the masks 150, 151.

Figure 8C:
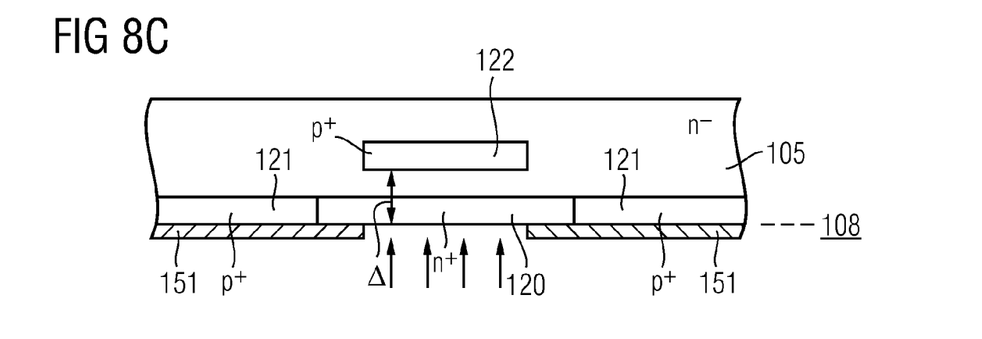

The p-type dopants introduced into the semiconductor body 105 through the second side 108 in the process illustrated in FIG. 8C define the p⁺-doped third semiconductor region 122.

Further processes may be carried out before, between or after the processes illustrated in FIGS. 8A to 8C. Examples of the further processes are processing of the anode at the first side 107, processing of electrodes such as anode and cathode electrodes at the first and second sides 107, 108, processing of junction termination regions such as junction termination extensions (JTE), floating guard ring structures, field plates, for example.

Figure 9A:
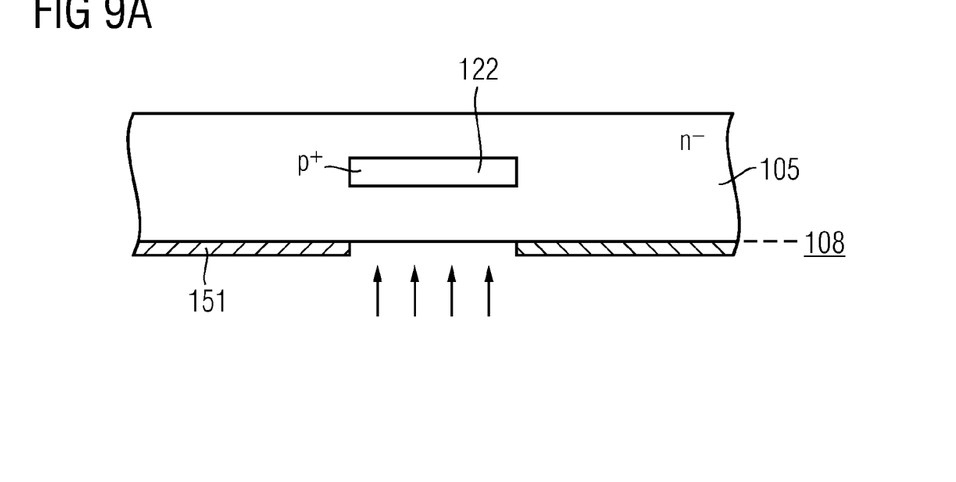
Figure 9B:
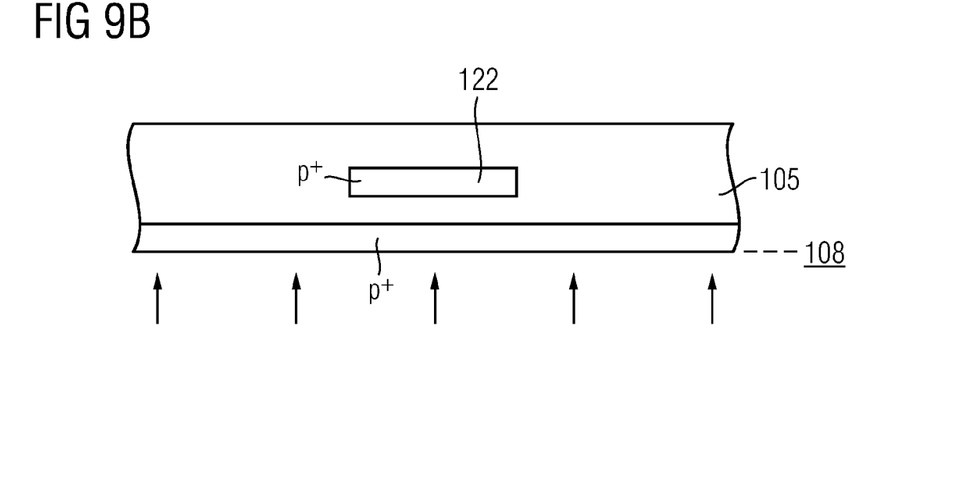
Figure 9C:
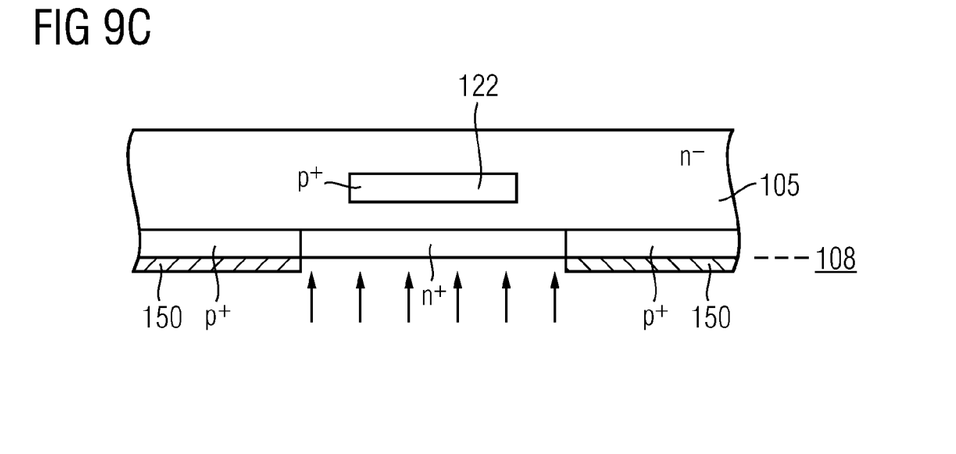

FIGS. 9A to 9C are cross-sectional views illustrating another embodiment of a method of manufacturing a semiconductor diode. The processes illustrated in FIGS. 9A to 9C are similar to the processes illustrated in FIGS. 8A to 8C but carried out in a different order.

Referring to the schematic cross-sectional view of FIG. 9A, p-type dopants are introduced into the semiconductor body 105 through the second side 108. The mask 151 covers areas at the second side 108 where the p-type dopants do not enter the semiconductor body 105. The p-type dopant introduced into the semiconductor body 105 define the p⁺-doped third semiconductor region 122 similar to the process described with respect to FIG. 8C.

Referring to the schematic cross-sectional view of FIG. 9B, the mask 151 is removed and p-type dopants are introduced into the semiconductor body 105 through the second side 108 similar to the process described with reference to FIG. 8A.

Referring to the schematic cross-sectional view of FIG. 9C, n-type dopants are introduced into the n⁻-doped semiconductor body 105 through the second side 108. A part of semiconductor body 105 at the second side 108 is covered by the mask 150, e.g. a patterned hard mask layer or a resist layer.

The n-type dopants introduced into the n⁻-doped semiconductor body 105 through the second side 108 counter-dope a corresponding part of the p-type dopants introduced beforehand. Thus, an area at the second side 108 that is not covered by the mask 150 defines the n⁺-doped first semiconductor region 120. A remaining part of the semiconductor body 105 doped with the p-type dopants through the second side 108 define the second semiconductor regions 121 similar to the described with reference to FIG. 8B.

FIGS. 10A to 10D are cross-sectional views for illustrating a method of manufacturing a semiconductor diode according to another embodiment.

Figure 10A:
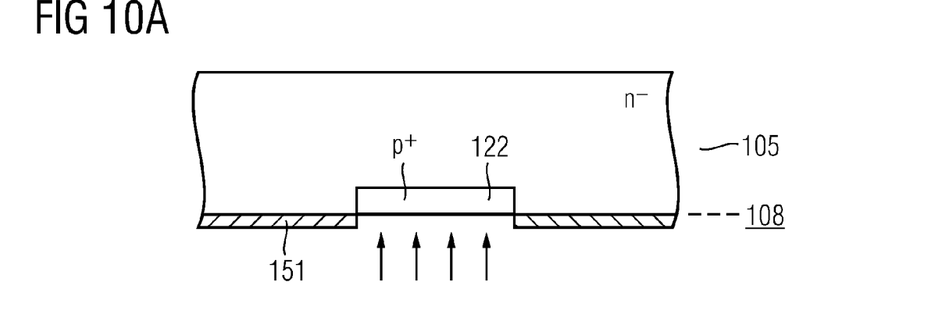

Referring to the schematic cross-sectional view of FIG. 10A, p-type dopants are introduced into the semiconductor body 105 through the second side 108 via the mask 151. The p-type dopants may be introduced into the semiconductor body by ion implantation and/or a diffusion process, for example. Thereafter, the mask 151 is removed. The p-type dopants define the third semiconductor region 122.

Figure 10B:
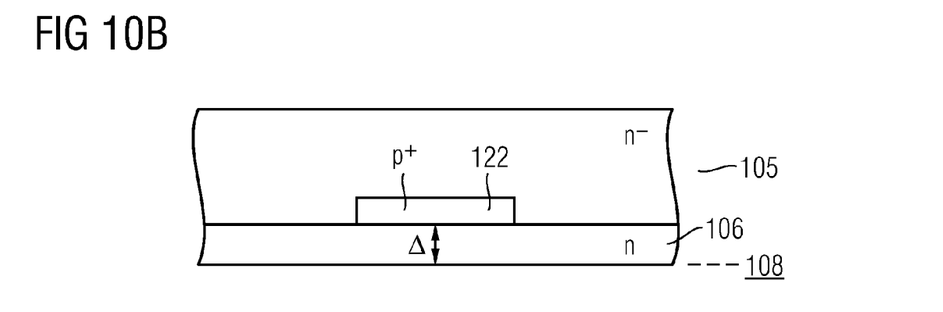

Referring to the schematic cross-sectional view of FIG. 10B, an n-doped semiconductor layer 106 is formed on the semiconductor body 105 at the second side 108, e.g. by an epitaxial process. The distance Δ between the third semiconductor region 122 and the second side 108 corresponds to a thickness of the n-doped semiconductor layer 106 being part of the semiconductor body 105.

Figure 10C:
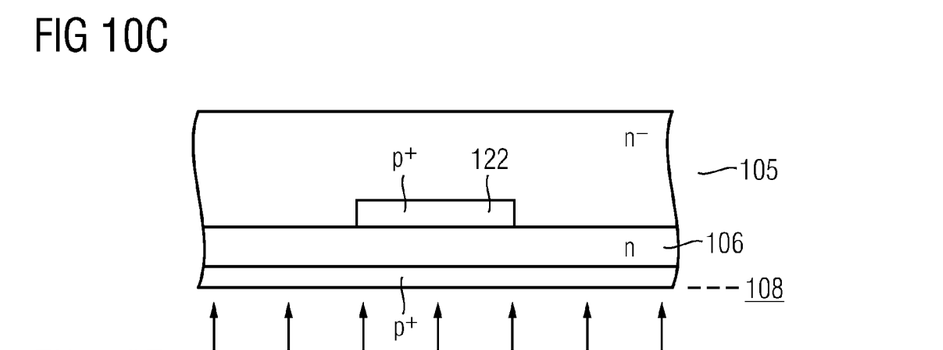

Referring to the schematic cross-sectional view of FIG. 10C, p-type dopants are introduced into the n-doped semiconductor layer 106 of the semiconductor body 105 through the second side 108. The p-type dopants may include one or more of the dopant species boron, antimony, aluminum, indium, for example. The p-type dopants may be introduced through the second side by ion implantation and/or diffusion, for example.

Figure 10D:
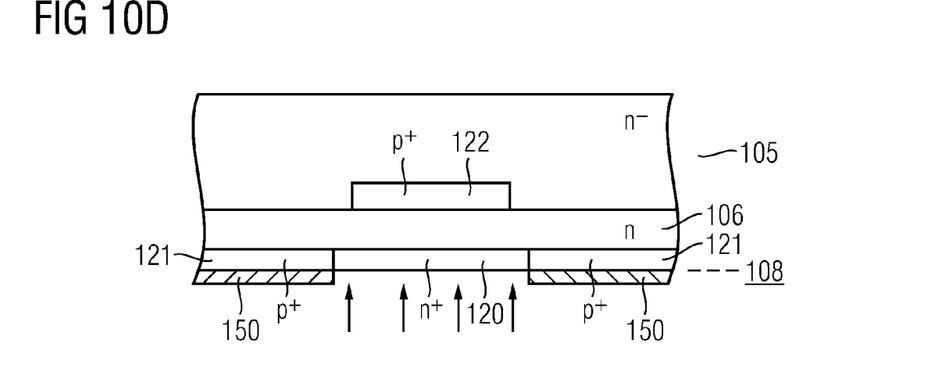

Referring to the schematic cross-sectional view of FIG. 10D, n-type dopants are introduced into the n-doped semiconductor layer 106 of the semiconductor body 105 through the second side 108. A part of the second side 108 is covered by the mask 150, e.g. a patterned hard mask layer or a resist layer.

The n-type dopants introduced into the n-doped semiconductor layer 106 of the semiconductor body 105 through the second side 108 counter-dope a corresponding part of the p-type dopants introduced beforehand. Thus, an area of the n-doped semiconductor layer 106 of the semiconductor body 105 at the second side 108 that is not covered by the mask 150 defines the n⁺-doped first semiconductor region 120. A remaining part of the n-doped semiconductor layer 106 of the semiconductor body 105 doped with the p-type dopants through the second side 108 define the second semiconductor regions 121.

An embodiment for manufacturing the semiconductor diode 1004 illustrated in FIG. 4 may be based on a structure as illustrated in FIG. 1 or 2 and further comprise introducing fourth p-type dopants into the semiconductor body 105 through the second side 108, wherein the fourth dopants counter-dope a part of the first dopants in at least the area $A_2$. A part of the first dopants may remain between the third semiconductor region 122 and a pn junction defined by the first and fourth dopants.

Another embodiment for manufacturing the semiconductor diode 1004 illustrated in FIG. 4 may be based on a structure as illustrated in FIG. 1 or 2 and further comprise increasing a lateral dimension of the second semiconductor region 121 by introducing fifth p-type dopants into the semiconductor body 105 through the second side 108. The fifth dopants counter-dope a part of the first dopants in at least an area overlapping a projection area of the third semiconductor region 122 onto the second side 108. The method further comprises introducing sixth n-type dopants into the semiconductor body 105 through the second side 108. The sixth n-type dopants counter-dope the fifth p-type dopants in at least a first portion of an area overlapping a projection area of the third semiconductor region 122 onto the second side 108. A lateral dimension of the first semiconductor region 120 is defined by a lateral dimension of the first portion.

Any combination of the first to sixth dopants having a same conductivity type, e.g. the second and third dopants may be of a same dopant species, include partly same dopant species or be of different dopant species.

The arrangement of the first to third semiconductor regions 120, 121, 122 formed by any of the methods described with reference to FIGS. 8A to 10D may include geometries and dimensions as described with reference to the embodiments illustrated in FIGS. 1 to 5, for example.

Although specific embodiments have been illustrated and described herein, it will be appreciated by those of ordinary skill in the art that a variety of alternate and/or equivalent implementations may be substituted for the specific embodiments shown and described without departing from the scope of the present invention. By way of example, the semiconductor regions illustrated in the figures related to the embodiments may have an opposite doping type, i.e. an n-type region may be a p-type region and a p-type region may be an n-type region. This application is intended to cover any adaptations or variations of the specific embodiments discussed herein. Therefore, it is intended that this invention be limited only by the claims and the equivalents thereof.

What is claimed is:

1. A semiconductor diode, comprising:
    a semiconductor body having opposite first and second sides;
    a first and a second semiconductor region consecutively arranged along a lateral direction at the second side, wherein the first and second semiconductor regions are of opposite first and second conductivity types and are electrically coupled to an electrode at the second side; and
    a third semiconductor region of the second conductivity type buried in the semiconductor body at a distance from the second side, wherein the second and third semiconductor regions are separated from each other, and the first semiconductor region of the first conductivity type contacts another semiconductor region of the first conductivity type.

2. The semiconductor diode of claim 1, wherein the second and third semiconductor regions are p-doped and the electrode at the second side is a cathode electrode at a cathode side of the semiconductor diode.

3. The semiconductor diode of claim 1, wherein the second and third semiconductor regions are striped-shaped extending along different lateral directions.

4. The semiconductor diode of claim 3, wherein a lateral distance between neighboring third semiconductor regions is in a range of 1.0 µm to 1000 µm.

5. The semiconductor diode of claim 1, wherein an area of the third semiconductor region projected onto the second side is included in an area of the first semiconductor region projected to the second side.

6. The semiconductor diode of claim 5, wherein a lateral distance between a lateral termination of the second semiconductor region and a lateral termination of the third semiconductor region is in a range of 0.1 µm to 5 µm.

7. The semiconductor diode of claim 1, further comprising a plurality of third semiconductor regions spaced apart from each other.

8. The semiconductor diode of claim 1, wherein a geometry of the third semiconductor regions is at least one of circular, polygonal, stripe-shaped.

9. The semiconductor diode of claim 1, wherein a thickness of the third semiconductor region along a vertical direction between the first and second sides is in a range of 0.2 µm to 20 µm.

10. The semiconductor diode of claim 1, wherein
    an area of the third semiconductor region projected onto the second side and an area of the second semiconductor region projected onto the second side overlap in an overlap area; and
    a lateral dimension l of the overlap area and a vertical distance d between the second and third semiconductor regions in the overlap area satisfy 0<d/l<2.

11. The semiconductor diode of claim 10, wherein the distance d is in a range of 0.1 µm to 5 µm.

12. The semiconductor diode of claim 10, wherein a thickness of the second semiconductor region outside of the overlap area is greater than a thickness of the second semiconductor region in the overlap area.

* * * * *